United States Patent [19]

Leung et al.

[11] Patent Number: 5,265,047
[45] Date of Patent: Nov. 23, 1993

[54] HIGH DENSITY SRAM CIRCUIT WITH SINGLE-ENDED MEMORY CELLS

[75] Inventors: Wingyu Leung, Cupertino; Fu-Chieh Hsu, Saratoga, both of Calif.

[73] Assignee: Monolithic System Technology, San Jose, Calif.

[21] Appl. No.: 848,551

[22] Filed: Mar. 9, 1992

[51] Int. Cl.[5] .................. G11C 11/00; G11C 17/00
[52] U.S. Cl. .......................... 365/154; 365/156
[58] Field of Search ............ 365/154, 156; 307/238, 307/279

[56] References Cited

U.S. PATENT DOCUMENTS

| | | | |
|---|---|---|---|
| 4,138,739 | 2/1979 | Robinson | 365/154 |
| 4,805,148 | 2/1989 | Diehl-Nagle et al. | 365/154 |
| 4,845,676 | 7/1989 | Lohlein et al. | 365/154 |
| 4,872,141 | 10/1989 | Plus et al. | 365/154 |
| 4,995,001 | 2/1991 | Dawson et al. | 365/154 |
| 5,040,146 | 8/1991 | Mattausch et al. | 365/154 |
| 5,047,979 | 9/1991 | Leung | 365/154 |
| 5,189,640 | 2/1993 | Huard | 365/154 |

FOREIGN PATENT DOCUMENTS

| | | | |
|---|---|---|---|
| 0142596 | 6/1986 | Japan | 365/154 |
| 0185798 | 7/1990 | Japan | 365/154 |

*Primary Examiner*—Eugene R. LaRoche
*Assistant Examiner*—Son Dinh
*Attorney, Agent, or Firm*—Skjerven, Morrill, MacPherson, Franklin & Friel

[57] ABSTRACT

A high density, static random access memory (SRAM) circuit with single-ended memory cells employs a plurality of (4T—2R) or (6T) type SRAM cells and a regenerative sense amplifier. Each of the SRAM cells employs a single bit-line (BL) and two word lines.

13 Claims, 3 Drawing Sheets

HIGH DENSITY SRAM CIRCUIT WITH SINGLE-ENDED MEMORY CELLS

BACKGROUND OF THE INVENTION

1. Field of the Invention

The present invention relates to CMOS-type digital integrated circuits generally and more particularly to static random access memory cells.

2. Description of the Prior Art

Static random access memories (SRAMs) employ a number of cells, each for storing a single binary bit of information. Typical SRAM cell structures include what is commonly referred to as a four transistor, two-resistor (4T−2R) SRAM cell and what is commonly referred to as a six transistor (6T) SRAM cell. A (4T−2R) SRAM 100 cell is illustrated in (prior art) FIG. 1. SRAM cell 100 is shown to include four N-channel transistors 110, 112, 114, and 116, and two (load) resistors 120 and 122. The N-channel transistors and the load resistors may be constructed using single-crystal, poly-crystalline or amorphous semiconductor materials. Transistor 110 is configured as a transfer transistor with the source (or drain) (end of the channel) of the transistor connected to an (active-high) bit (input-/output) line (BL), which is designated 130. The gate of transistor 110 is connected to an (active-high) word (control) line (WL) 132. The drain (or source) (end of the channel) of transistor 110 is coupled by resistor 120 to a power supply potential (Vcc) line 134.

Transistor 112 is configured as a pull-down transistor with the transistor source connected to circuit ground (Vss), with the transistor gate coupled by resistor 122 to power supply line 134, and with the transistor drain connected to the drain of transistor 110. Transistor 114 is also configured as a pull-down transistor with the transistor source connected to circuit ground, with the transistor gate connected to the drain of transistor 110, and with the transistor drain connected to the gate of transistor 112. Finally, transistor 116 is also configured as a transfer transistor with the transistor source connected to the gate of transistor 112, with the transistor gate connected to word line (WL) 132, and with the transistor drain connected to an (active-low) bit (input-/output) line (/BL) 140. The lines 150 and 152 are connecting the cross-coupling gates and drains of the pull-down transistors.

A six transistor (6T) SRAM cell 200 is illustrated in (prior art) FIG. 2. SRAM cell 200 is shown to include four N-channel transistors designated 210, 212, 214, and 216, and two P-channel (load) transistors 220 and 222. The N-channel and P-channel transistors may be constructed using single-crystal, poly-crystalline or amorphous semiconductor materials. Transistor 210 is configured as a transfer transistor with the source (or drain) (end of the channel) of the transistor connected to an (active-high) bit (input/output) line (BL) 230. The gate of transistor 210 is connected to an (active-high) word (control) line (WL) 232. The drain (or source) (end of the channel) of transistor 210 is connected to a node which is connected to the source of transistor 220, to the drain of transistor 212, and to the gate of both transistors 214 and 222. Connected to another node is the gate of both transistors 220 and 212, the source of transistor 222, the drain of transistor 214, and the source of transistor 216. The drain of both transistors 220 and 222 are connected to a power supply potential (Vcc) line 234; the sources of both transistors 212 and 214 are connected to circuit ground (Vss). The gate of transistor 216 is connected to word line (WL) 232; the drain of the transistor is connected to an (active-low) bit (input-/output) line (/BL) 240.

In the implementation of high density SRAMs, the cell size is one of the more critical parameters as it determines the total area of the memory array, and therefore the chip size. Heretofore for poly-silicon-resistor load (4T−2R) SRAM cells in the conventional planar layout, the size of the pull-down transistor 114 has accounted for a significant portion of the cell area. This is because heretofore the pull-down transistor 114 size had to be about three times that of the transfer transistor 116 to prevent the state of the cell from being upset when transfer transistor 116 is turned on when the state of the cell is being read.

The reader may find of interest U.S. Pat. Nos. 4,794,561 and 4,876,215 issued to Fu-Chieh Hsu, which disclose the static RAM cells of (prior art) FIGS. 1 and 2.

In laying out the memory cell with minimum area, one recent approach is to split the common word line (WL) (as in FIGS. 1 and 2) into two separate lines at both end of the memory cell to facilitate interconnecting the cross-coupled transistors within the memory cell (see, for example, Itabashi et al., "A split wordline cell for 16 Mb SRAM using polysilicon sidewall contacts", pp.477-480, and Ohkubo et al., "16 Mb SRAM cell technologies for 2.0 V operation", pp.481-484, 1991 IEDM Technical Digest). Electrically, however, the two split word lines (WL) are connected together and are always driven simultaneously to conform to the circuit configuration of (prior art) FIGS. 1 and 2.

In another approach described in U.S. Pat. No. 5,047,979 issued to Wingyu Leung, a regenerative sense amplifier is used to minimize the SRAM cell area by allowing the use of much smaller pull-down transistors (See FIGS. 3 and 4 therein) without upsetting the state of the memory cell when it is being read.

The reduction in memory cell area in both the above approaches, however, is limited by the need to use two complementary (differential) bit lines (BL and /BL) in each memory cell.

SUMMARY OF THE INVENTION

The primary object of the present invention is to provide a static random access memory (SRAM) cell of minimum size.

Another object of the present invention is to provide a high speed static random access memory (SRAM) circuit.

Briefly, a high density, static random access memory (SRAM) circuit with single-ended, ratio-independent memory cells in accordance with the present invention employs a plurality of (4T−2R) or (6T) type SRAM cells and a regenerative sense amplifier. Each of the SRAM cells of the present invention differ from prior art type SRAM cells (see above referenced U.S. Pat. No. 5,047,979) in that the SRAM cells of the present invention each include only a single bit line (BL) for reading the state of each memory cell and each include transistors of similar size (channel width).

These and other objects of the present invention will be apparent to those skilled in the art in light of the detailed description of the embodiments of the present invention illustrated in the accompanying figures.

DETAILED DESCRIPTION OF THE INVENTION

Figure 1:
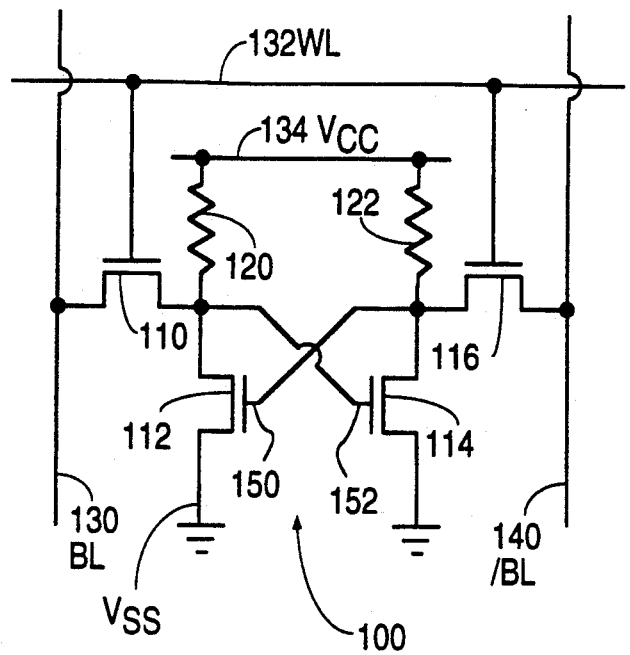
FIG. 1 is a schematic diagram of a prior art type (4T—2R) SRAM cell.
Figure 2:
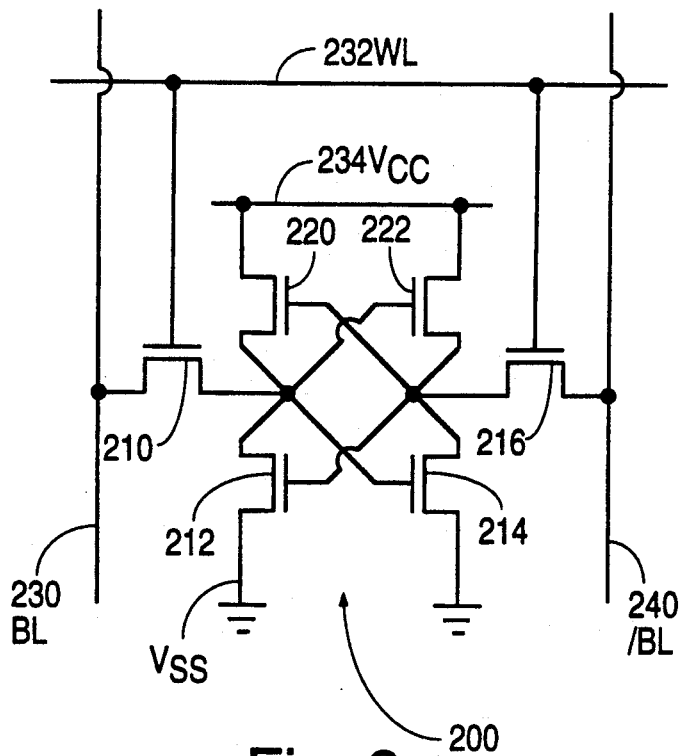
FIG. 2 is a schematic diagram of a prior art type (6T) SRAM cell.
Figure 3:
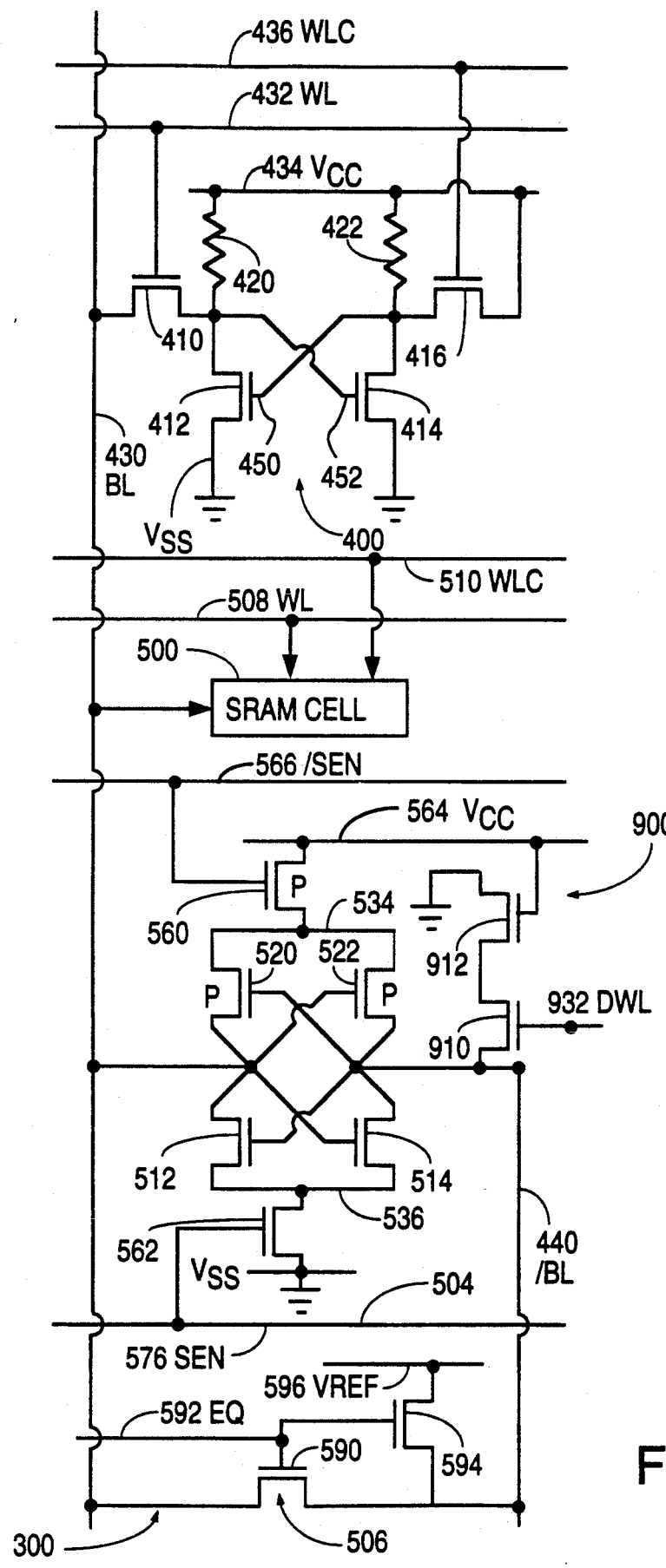
FIG. 3 is a four transistor, two resistor (4T—2R), high density, static random access memory (SRAM) circuit with single-ended memory cells in accordance with the present invention.

One embodiment of a four transistor, two resistor (4T—2R), high density static random access memory (SRAM) circuit 300 with single-ended memory cells in accordance with the present invention is illustrated in FIG. 3. Circuit 300 employs a SRAM cell 400. SRAM cell 400 is different from the above-mentioned prior art (4T—2R) SRAM cell 100. Like SRAM cell 100, SRAM cell 400 includes four N-channel transistors 410, 412, 414, and 416, and two (load) resistors 420 and 422. But unlike SRAM cell 100, the transistors and resistors of SRAM cell 400 are configured differently. Transistor 410 is configured as a transfer transistor with the source (or drain) (end of the channel) of the transistor connected to an (active-high) bit (input/output) line (BL) 430. The gate of transistor 410 is connected to an (active-high) word (control) line (WL) 432. The drain (or source) (end of the channel) of transistor 410 is coupled by resistor 420 to a power supply potential (Vcc) line 434. Transistor 412 is configured as a pull-down transistor with the transistor source connected to circuit ground (Vss), with the transistor gate coupled by resistor 422 to power supply line 434, and with the transistor drain connected to the drain of transistor 410. Transistor 414 is also configured as a pull-down transistor with the transistor source connected to circuit ground, with the transistor gate connected to the drain of transistor 410, and with the transistor drain connected to the gate of transistor 412. Finally, transistor 416 is also configured as a transfer transistor with the transistor source connected to the gate of transistor 412, with the transistor gate connected to a second word (control) line (WLC) 436, and with the transistor drain connected to power supply line 434. The lines 450 and 452 are connecting the cross-coupling gates and drains of the pull-down transistors. Only one bit line (BL) is needed in the SRAM cell 400, and two separate word lines (WL and WLC) are used in each memory cell. Also, SRAM cell 400 of the present invention differs from the above mentioned, prior art (4T—2R) SRAM cell 100 in that the size (channel width) of each of the transistors 410, 412, 414, and 416 can be as small as possible to allow for minimum cell area. Thus, the transistors 410, 412, 414, and 416 may all have sizes within 50% of a predetermined value, and need not be of substantially different sizes.

In addition, the present embodiment of (4T—2R) SRAM circuit 300 employs a plurality of additional SRAM cells, which are collectively represented by a cell 500, a regenerative sense amplifier 504, and a bit line equalization (precharge) circuit 506.

Each of the, additional SRAM cells 500, which are each similar to SRAM cell 400, are similarly configured. Each of the SRAM cells is connected to bit line (BL) 430. Further each of the SRAM cells is connected to a respective word line (WL) 508 and a respective second word line (WLC) 510.

Regenerative sense amplifier 504 includes two, N-channel transistors 512 and 514, and two P-channel (load) transistors 520 and 522. The transistors are configured with the bit (input/output) line (BL) 430 connected to the source of transistor 520, to the drain of transistor 512, and to the gate of both transistors 514 and 522. Connected to a node (/BL) 440, is the gate of both transistors 520 and 512, the source of transistor 522, and the drain of transistor 514. The drains of both transistors 520 and 522 are connected to a line 534; the sources of both transistors 512 and 514 are connected to a line 536. In addition, regenerative sense amplifier 504 includes a P-channel transistor 560, and an N-channel transistor 562. Transistor 560 is configured with the transistor source connected to a power supply potential (Vcc) line 564, with the transistor gate connected to an (active-low) sense amplifier selecting line (/SEN) 566, and with the transistor drain connected to line 534. Transistor 562 is configured with the transistor source connected to circuit ground (Vss), with the transistor gate connected to an (active-high) sense amplifier selecting line (SEN) 576, and with the transistor drain connected to line 536.

Bit line equalization (precharge) circuit 506 includes an N-channel transistor 590, which is configured with the transistor gate connected to an (active-high) equalization control line (EQ) 592, with one of the ends of the transistor channel (the source or drain) connected to the bit line (BL) 430, and with the other one of the ends of the transistor channel connected to node (/BL) 440, which is also connected to a common reference line (VREF), designated 596, through an N-channel transistor 594, the gate of which is connected to the equalization control line (EQ) 592.

Operationally, before signals of active state are developed on the word and sense amplifier select lines 432, 436, 508, 510, 576, and 566, a signal of active state (a high logic potential level signal) is developed on equalization control line (EQ) 592. Responsive thereto, bit line equalization (precharge) circuit 506 transistors 590 and 594 are operative to conduct charge between the bit line (BL) 430, the node (/BL) 440 and the reference line (VREF) 596, precharging the lines to equal potential levels of VREF which may be approximately one half of the power supply potential level.

After the state of the equalization control line (EQ) 592 signal is returned to the inactive state and before signals of active state are developed on the sense amplifier select lines 576 and 566, a signal of active state (high logic potential level) is developed on one of the word lines (WL) 432, 508. Responsive thereto, the bit line 430 begins to charge to a potential, the logic level of which represents the state of the binary bit of information stored in the selected SRAM cell. Specifically, when a high logic potential level (active) signal is developed on word line (WL) 432, the bit line 430 begins to charge (or discharge) to a potential, the logic level of which represents the state of the binary bit of information stored in the selected SRAM cell 400. When SRAM cell 400 is in the state in which transistor 414 is "off" and transistor 412 is "on", transistor 412 begins to discharge bit line (BL) 430 to a low logic potential level. When SRAM cell 400 is in the state in which transistor 412 is "off" and transistor 414 is "on", the internal node 452 begins to charge bit line (BL) 430 to a high logic potential level.

While the signal developed on the word line (WL) still has an active state (high logic potential level), signals of active state are developed on the sense amplifier select lines (a high logic potential level signal being developed on sense amplifier select line (SEN) 576 and a low logic potential level signal being developed on sense amplifier select line (/SEN) 566), the charge on the bit line drives regenerative sense amplifier 504 into the state which corresponds to the state of the binary bit of information stored in the selected SRAM cell 400.

After the regenerative sense amplifier 504 "reads" the state of the binary bit of information stored in the selected SRAM cell 400 while the word line (WL) 432 still has an active state, the second word line (WLC) 436 of the selected SRAM cell is pulsed to active state (high logic potential level) temporarily to allow the internal node 450 to charge to a high logic potential level, the amplifier then "rewrites" the state of the binary bit of information back into the selected SRAM cell.

It is important to note that, due to the regenerative nature of the regenerative sense amplifier 504 and due to the differential nature of the signals (BL and /BL) driving the inputs of the amplifier, the amplifier speeds up development of the signals on the bit line. Further, the sense amplifier amplifies the small differential potential levels developed on the bit line and the reference line to full logic levels. Finally, the sense amplifier provides high drive capability.

The circuit 300 may optionally further include dummy cell circuitry 900, for providing improved equalization and sense amplifier operations. The node (/BL) is further connected to the drain (or source) end of N-channel transistor 910, the gate of which is connected to a signal line (DWL) 932, and the source (or drain) of transistor 910 is connected to the drain (or source) end of N-channel transistor 912. The gate and source (or drain) of transistor 912 are connected to power supply Vcc and to Vss (ground), respectively. The transistor 910 has a size (the ratio of channel width over channel length) equal to approximately one-half of that of the transistor 410. The transistor 912 has a size (the ratio of channel width over channel length) equal to approximately one-half of that of transistor 412. When a full supply voltage is applied to the signal line (DWL) 932, the transistors 910 and 912 conduct a current equal to approximately one-half of that of transistors 410 and 412 when a full supply voltage is applied to the word line (WL) 432 and node 450. This dummy cell thereby provides a consistent differential input driving signal, which is equal to approximately one-half of the current conducted in transistors 410 and 412 when a full supply voltage is applied to the word line (WL) 432 and node 450, to indicate to the regenerative sense amplifier whether the binary bit stored in the selected memory cell is "0" or "1".

Figure 4:
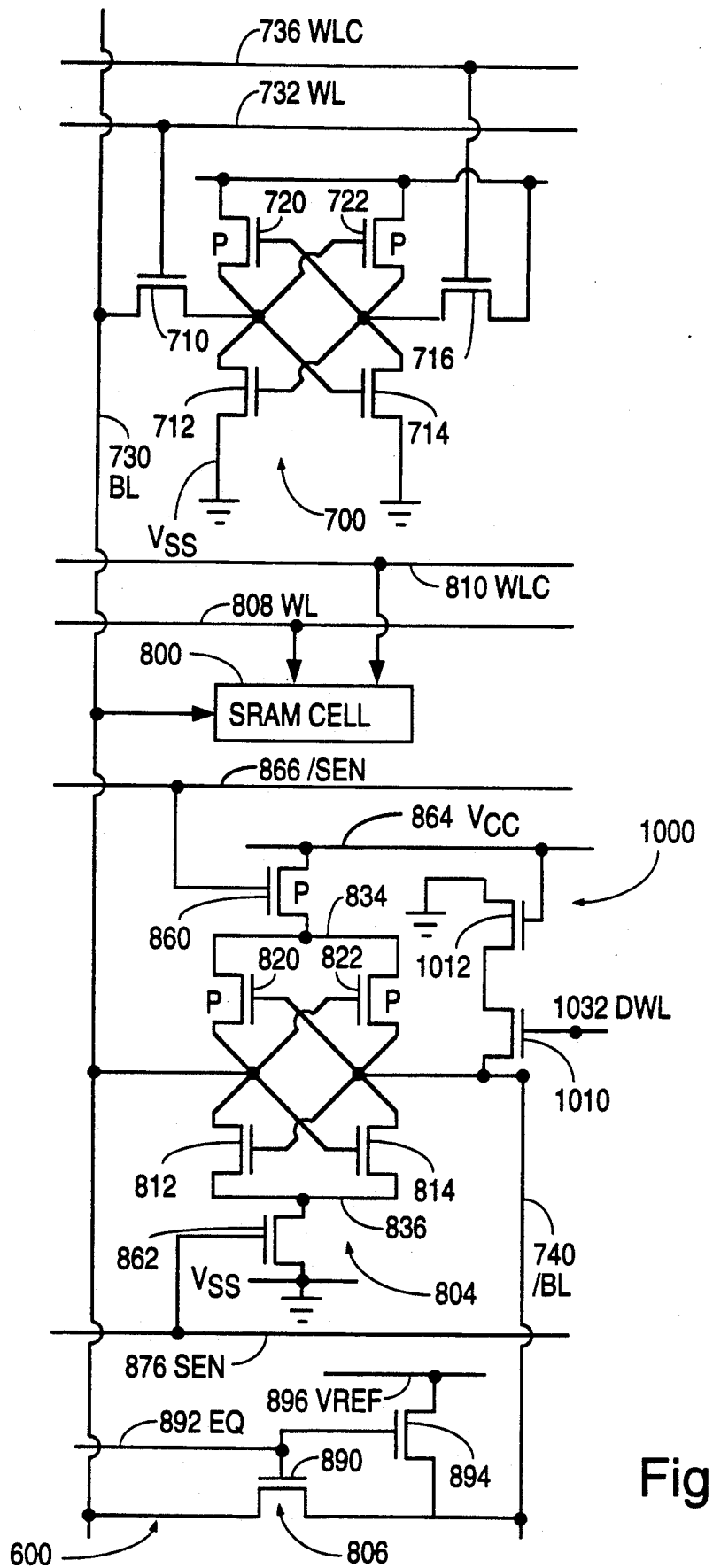
FIG. 4 is a six transistor (6T), high density, static random access memory (SRAM) circuit with single-ended memory cells in accordance with the present invention.

The six transistor (6T), high density static random access memory (SRAM) circuit with single-ended memory cells 600 in accordance with the present invention is illustrated in FIG. 4. Circuit 600 employs an SRAM cell 700. SRAM cell 700 is different from the above mentioned prior art (6T) SRAM cell 200. Like SRAM cell 200, SRAM cell 700 includes four N-channel transistors 710, 712, 714, and 716, and two P-channel (load) transistors 720 and 722. But unlike SRAM cell 200, the transistors of SRAM cell 700 are configured differently. Transistor 710 is configured as a transfer transistor with the source (or drain) (end of the channel) of the transistor connected to an (active-high) bit (input/output) line (BL), which is designated 730. The gate of transistor 710 is connected to an (active-high) word (control) line (WL) 732. The drain (or source) (end of the channel) of transistor 710 is connected to a node which is connected to the source of transistor 720, to the drain of transistor 712, and to the gate of both transistors 714 and 722. Connected to another node is the gate of both transistors 720 and 712, the source of transistor 722, the drain of transistor 714, and the source of transistor 716. The drains of both transistors 720 and 722 are connected to a power supply potential (Vcc) line 734; and the sources of both transistors 712 and 714 are connected to circuit ground (Vss). The gate of transistor 716 is connected to a second word line (WLC) 736; and the drain of the transistor is connected to the power supply line 734.

Only one bit line (BL) is needed in the SRAM cell 700, and two separate word lines (WL, and WLC) are used in each memory cell. Also, SRAM cell 700 of the present invention differs from the above mentioned prior art (6T) SRAM cell 200 in that the size (channel width) of each of the transistors 710, 712, 714, and 716 can be as small as possible to allow for minimum cell area. Thus, transistors 710, 712, 714, and 716 may all have sizes within 50% of a predetermined value, and need not be of substantially different sizes.

In addition, the (6T) SRAM circuit 600 employs a plurality of additional SRAM cells collectively represented by a cell 800, a regenerative sense amplifier 804, and a bit line equalization (precharge) circuit 806.

Each of the additional SRAM cells 800, which are each similar to SRAM cell 700, are similarly configured. Each of the SRAM cells is connected to bit line (BL) 730. Further, each of the SRAM cells is connected to a respective first word line (WL) 808 and a respective second word line (WLC) 810.

Regenerative sense amplifier 804 includes two, N-channel transistors 812 and 814, and two P-channel (load) transistors 820 and 822. The transistors are configured with the bit (input/output) line (BL) 830 connected to the source of transistor 820, to the drain of transistor 812, and to the gate of both transistors 814 and 822. Connected to a node (/BL) 740 are the gates of both transistors 820 and 812, the source of transistor 822, and the drain of transistor 814. The drains of both transistors 820 and 822 are connected to a line 834; and the sources of both transistors 812 and 814 are connected to a line 836. In addition, regenerative sense amplifier 804 includes a P-channel transistor 860, and an N-channel transistor 862. Transistor 860 is configured with the transistor source connected to a power supply potential (Vcc) line 864, with the transistor gate connected to an (active-low) sense amplifier selecting line (/SEN) 866, and with the transistor drain connected to line 834. Transistor 862 is configured with the transistor source connected to circuit ground (Vss), with the transistor gate connected to an (active-high) sense amplifier selecting line (SEN) 876, and with the transistor drain connected to line 836.

Bit line equalization (precharge) circuit 806 includes an N-channel transistor 890, which is configured with the transistor gate connected to an (active-high) equalization control line (EQ) 892, with one of the ends of the transistor channel (the source or drain) connected to the bit line (BL) 730, and with the other one of the ends of the transistor channel connected to node (/BL) 740, which is also connected to a common reference line (VREF) 896, through an N-channel transistor 894, the gate of which is connected to the equalization control line (EQ) 892.

The circuit 600 may optionally further include dummy cell circuitry 1000, for providing improved equalization and sense amplifier operations. The node (/BL) is further connected to the drain (or source) end of N-channel transistor 1010, the gate of which is connected to a signal line (DWL) 1032, and the source (or drain) of transistor 1010 is connected to the drain (or source) end of N-channel transistor 1012. The gate and source (or drain) of transistor 1012 are connected to power supply lines Vcc and Vss, respectively. The transistor 1010 has a size (the ratio of channel width over channel length) equal to approximately one-half of that of the transistor 710. The transistor 1012 has a size (the ratio of channel width over channel length) equal to approximately one-half of that of transistor 712. When a full supply voltage is applied to the signal line (DWL) 1032, the transistors 1010 and 1012 conduct a current equal to approximately one-half of that of transistors 710 and 712 when a full supply voltage is applied to the word line (WL) 732 and the gate of transistor 712. This dummy cell thereby provides a consistent differential input driving signal, which is equal to approximately one-half of the current conducted in transistors 710 and 712 when a full supply voltage is applied to the word line (WL) 732 and the gate of transistor 712, to indicate to the regenerative sense amplifier whether the binary bit stored in the selected memory cell is "0" or "1".

In one embodiment, the various components of SRAM circuit 300 are all conventionally integrated into a single device using CMOS fabrication technology, as are the various components of SRAM circuit 600.

It is contemplated that in light of the preceding disclosure, certain alterations and modifications of the present invention will become apparent to those skilled in the art. It is therefore intended that the following claims be interpreted to cover all such alterations and modifications.

What is claimed is:

1. A static, random access memory cell comprising: a bit line;
   a first word line;
   a second word line;
   a first resistor;
   a second resistor;
   a first transistor having a gate connected to said first word line and a channel having a first end connected to said bit line and a second end coupled by said first resistor to a power supply potential;
   a second transistor having a gate connected to said second word line and a channel having a first end connected to the power supply potential and a second end coupled by said second resistor to the power supply potential;
   a third transistor having a gate connected to said second transistor channel second end and a channel connected between the said first transistor channel second end and a circuit ground potential;
   a fourth transistor having a gate connected to said first transistor channel second end and a channel connected between said second transistor channel second end and the circuit ground potential.

2. A static, random access memory circuit as recited in Claim 1, further comprising:
   regenerative sense amplifier including:
      a regenerative sense amplifier first line;
      a regenerative sense amplifier second line;
      an internal node;
      a first transistor having a gate connected to said internal node and a channel connected between said bit line and said regenerative sense amplifier second line;
      a second transistor having a gate connected to said bit line and a channel connected between said internal node and said regenerative sense amplifier second line;
      a third transistor having a gate connected to said internal node and a channel connected between said regenerative sense amplifier first line and said bit line; and
      a fourth transistor having a gate connected said bit line and a channel connected between said regenerative sense amplifier first line and said internal node.

3. A static, random access memory circuit as recited in claim 2, wherein said regenerative sense amplifier further includes:
   a first sense amplifier selecting line;
   a second sense amplifier selecting line;
   a fifth transistor having a gate connected to said regenerative sense amplifier first sense amplifier selecting line and a channel connected between said regenerative sense amplifier first line and the power supply potential; and
   a sixth transistor having a gate connected to said regenerative sense amplifier second sense amplifier selecting line and a channel connected between said regenerative sense amplifier second line and the circuit ground potential.

4. A static, random access memory circuit as recited in claim 1 wherein said memory cell first, second, third, and fourth transistors each have a channel width which is approximately fifty percent of a predetermined width.

5. A static, random access memory circuit as recited in claim 2 further comprising a bit line equalization circuit including:
   an equalization control line;
   a voltage reference line;
   a first transistor having a gate connected to said equalization control line and a channel connected to said memory cell bit line and said internal node; and
   a second transistor having a gate connected to said equalization control line and a channel connected to said internal node and said voltage reference line.

6. A static, random access memory circuit as recited in claim 2 further comprising a dummy cell circuit including:
   a dummy word line;
   a first transistor having a gate connected to said dummy word line and a channel having a first end connected to said internal node and a second end; and
   a second transistor having a gate connected to the power supply potential and a channel connected to said dummy cell first transistor channel second end and the circuit ground potential.

7. A static, random access memory cell comprising:
   a bit line;

a first word line;
a second word line;
a first transistor having a gate connected to said first word line and a channel having a first end connected to said bit line and a second end;
a second transistor having a gate connected to said second word line and a channel having a first end connected to the power supply potential and a second end;
a third transistor having a gate connected to said second transistor channel second end and a channel connected between the said first transistor channel second end and a circuit ground potential; and
a fourth transistor having a gate connected to said first transistor channel second end and a channel connected between said second transistor channel second end and the circuit ground potential;
a fifth transistor having a gate connected to said second transistor channel second end and a channel connected from said first transistor channel second end to a power supply potential; and
a sixth transistor having a gate connected to said first transistor channel second end and a channel connected from said second transistor channel second end to the power supply potential.

8. A static, random access memory circuit as recited in claim 7, further comprising a regenerative sense amplifier including:
a regenerative sense amplifier first line;
a regenerative sense amplifier second line;
an internal node;
a first transistor having a gate connected to said internal node and a channel connected between said memory cell bit line and said regenerative sense amplifier second line;
a second transistor having a gate connected to said memory cell bit line and a channel connected between said internal node and said regenerative sense amplifier second line;
a third transistor having a gate connected to said internal node and a channel connected between said regenerative sense amplifier first line and said memory cell bit line; and
a fourth transistor having a gate connected said memory cell bit line and a channel connected between said regenerative sense amplifier first line and said internal node.

9. A static, random access memory circuit as recited in claim 8 wherein said regenerative sense amplifier further includes:
a first sense amplifier selecting line;
a second sense amplifier selecting line;
a fifth transistor having a gate connected to said regenerative sense amplifier first sense amplifier selecting line and a channel connected between said regenerative sense amplifier first line and the power supply potential; and
a sixth transistor having a gate connected to said regenerative sense amplifier second sense amplifier selecting line and a channel connected between said regenerative sense amplifier second line and the circuit ground potential.

10. A static, random access memory circuit as recited in claim 7 wherein said memory cell first, second, third, and fourth transistors each have a channel width which is within fifty percent of a predetermined width.

11. A static, random access memory circuit as recited in claim 8 further comprising a bit line equalization circuit including:
an equalization control line;
a voltage reference line;
a first transistor having a gate connected to said equalization control line and a channel connected to said memory cell bit line and said internal node; and
a second transistor having a gate connected to said equalization control line and a channel connected to said internal node and said voltage reference line.

12. A static, random access memory circuit as recited in claim 8 further comprising a dummy cell circuit including:
a dummy word line;
a first transistor having a gate connected to said dummy word line and a channel having a first end connected to said internal node; and
a second transistor having a gate connected to the power supply potential and a channel connected to said dummy cell first transistor channel second end and the circuit ground potential.

13. A static random access memory cell comprising:
a bit line;
a first source of control signals;
a second source of control signals;
a first load having a first end connected to a reference potential;
a second load having a first end connected to the reference potential;
a first transistor connecting the second end of the first load to ground;
a second transistor connecting the second end of the second load to ground;
a first transfer switch connected between the bit line and a gate of the second transistor and controlled by the control signals from the first source; and
a second transfer switch connected between the reference potential and a gate of the first transistor and controlled by the control signals from the second source;
wherein a second end of the first load is connected to the gate of the second transistor, and a second end of the second load is connected to the gate of the first transistor.

* * * * *